United States Patent [19]

Humphrey

[11] Patent Number: 4,935,739

[45] Date of Patent: Jun. 19, 1990

[54] ENCODER

[75] Inventor: Frank A. Humphrey, New Malden, England

[73] Assignee: British Gas PLC, London, England

[21] Appl. No.: 256,564

[22] Filed: Oct. 12, 1988

[30] Foreign Application Priority Data

Oct. 12, 1987 [GB] United Kingdom ............... 8723892

[51] Int. Cl.$^5$ ............................................. H03M 1/22
[52] U.S. Cl. .......................................... 341/16; 341/7; 200/11 DA; 200/24
[58] Field of Search .................... 341/5, 7, 9, 16, 143; 200/11 R, 11 DA, 16 D, 24

[56] References Cited

U.S. PATENT DOCUMENTS

| | | | |
|---|---|---|---|
| 3,188,407 | 6/1965 | Avgerinos | 341/16 |
| 3,299,423 | 1/1967 | Chapsky et al. | 341/16 |
| 3,310,801 | 3/1967 | Hood, Jr. et al. | 341/16 |
| 3,432,847 | 3/1969 | Eccles et al. | 341/16 |
| 3,445,841 | 5/1969 | Parkinson | 341/7 |
| 3,621,162 | 11/1971 | Wall | 200/11 DA |
| 3,629,525 | 12/1971 | Glese | 200/11 DA |
| 3,983,342 | 9/1976 | Scarpardine | 200/24 |
| 3,999,022 | 12/1976 | Hosemann | 341/7 |
| 4,135,065 | 1/1979 | Nicot | 200/11 DA |
| 4,212,000 | 7/1980 | Yamada | 341/7 |
| 4,599,605 | 7/1986 | Froeb et al. | 200/11 DA |
| 4,861,951 | 8/1989 | Olson | 200/11 DA |

Primary Examiner—William M. Shoop, Jr.
Assistant Examiner—Gary J. Romano
Attorney, Agent, or Firm—Oblon, Spivak, McClelland, Maier & Neustadt

[57] ABSTRACT

An encoder device encodes angular position in the form of electrical signals in dependence on the position of a rotatable member in relation to a series of discrete fixed contacts disposed about the axis of rotation of a rotatable member. A series of discrete fixed contacts 2a, 2b, carried by a panel 1, form a first group of contacts of a flexible switch structure which also has a second group of contacts 9 carried by a flexible sheet 7 and arranged such that each contact of the second group is located opposite to, but spaced from, one of the series forming the first group of contacts. An intermediate sheet 8 is sandwiched between the panel 1 and flexible sheet 7 and is apertured at 10 in the region of the contact sets 2a, 2b and 9. The rotatable member carries a switch actuator 14 which operates to close any of the oppositely disposed first and second contact sets, in dependence upon its angular position, the switch actuator being such that either one contact set is closed or two adjacent contact sets are closed for any angular position of the rotatable member. The output is derived from terminal areas 6 on the panel 1.

15 Claims, 1 Drawing Sheet

ENCODER

FIELD OF THE INVENTION

The present invention relates to an encoder for encoding angular position in the form of electrical signals, in dependence on the position of a rotatable member in relation to a series of discrete fixed contacts disposed about the axis of rotation of the rotatable member.

The invention finds particular application in relation to the electrical reading of the position of a series of rotatable drums, each bearing numbers or other indicia around its periphery, in order to give a readout at a remote position according to the position of the drums. Such drum arrangements are commonly employed in meters for measuring the consumption of products such as fluids for example, domestic gas.

BACKGROUND OF THE INVENTION

In order to carry out the remote reading of meters, such as domestic gas meters, analogue information relating to drum position needs to be converted into electrical signals in the form of digital pulses. The analogue information can be converted into digital form by encoders operating according to either the incremental method or the absolute method. In both cases the digital information is fed to a microprocessor which in turn produces the appropriate reading at a remote point.

Incremental encoders convert the analogue information given by the rotation of the drum shafts into electrical pulses. One example of an incremental system consists of a magnetically operated switch which is activated by the movement of the drum representing, e.g., cubic feet of gas. Each activation increases a remote electronic counter by one digit, corresponding to an increase in gas consumption of one cubic foot. However, incremental encoders, although relatively inexpensive compared with absolute encoders, exhibit a number of undesirable features.

Firstly, they are prone to electrical noise, which can use extraneous pulses to be counted. These extra counts can only be reconciled after comparing the "true" meter reading with the stored information i.e., a visual inspection of the meter index reading given by the drums is required. Secondly, in the event of power failure, the encoder becomes inoperative and data is lost. Thirdly, in the event of a meter exchange, reconciliation of the stored information is required.

One solution to the above mentioned problems is to use absolute encoded indexes. Absolute encoders digitise the whole meter index reading i.e., each digit of each drum is encoded. The advantage of this method is that it is self-correcting, unlike incremental systems. Thus, the problem associated with electrical interference can be overcome by taking and comparing several readings. If these differ by, say, more than one digit, then additional readings can be taken. This can be repeated until the difference in readings is acceptable. Also, in the event of a power failure, an absolute encoded index maintains coding of the drums. On resumption of power, the meter can then be read with no loss of data. A further advantage of absolute encoders is that, in the event of meter exchanges, reconciliation of the meter reading is not required.

In summary, absolute encoders are self-correcting, whilst incremental encoders are not.

Although absolute encoders are known, existing types are based on the concept of employing one single rotatable contact associated with a series of discrete contacts, for each drum. With such an arrangement, it is possible for a rotatable contact to come to rest in the space between two adjacent fixed contacts, thereby giving a null reading and producing a resultant output error. Although arrangements have been proposed to overcome this disadvantage, these can still give rise to errors in the output readings obtained.

OBJECT OF THE INVENTION

It is an object of the present invention to provide an improved encoder intended to operate according to the absolute principle and employing flexible switch technology.

SUMMARY OF THE INVENTION

From one aspect, the invention provides an encoder device for encoding angular position in the form of electrical signals in dependence on the position of a rotatable member in relation to a series of discrete fixed contacts disposed about the axis of rotation of the rotatable member. The series of discrete fixed contacts form a first group of contacts of a flexible switch structure which also has a second group of contacts arranged such that each contact of the second group is located opposite to, but spaced from, one of the series forming the first group of contacts to form a contact set. The rotatable member carries a switch actuating means which operates to close any of the contact sets, in dependence upon its angular position, the switch actuating means being such that either one contact set is closed or two adjacent contact sets are closed for any angular position of the rotatable member.

From another aspect the invention provides an absolute encoder comprising a plurality of such encoder devices in combination with circuit means for producing an absolute encoded output.

BRIEF DESCRIPTION OF THE DRAWINGS

The invention will now be further described, by way of example, with reference to the accompanying drawings in which.

DETAILED DESCRIPTION OF THE PRESENTLY PREFERRED EMBODIMENTS

The encoder devices to be described are intended for use in conjunction with a series of rotatable drums disposed side by side for rotation about a common axis and each bearing a series of numbers, for example a decade, about their periphery. Such an arrangement may form the numerical read-out display of a meter such as a gas meter. One encoder device is associated with each such drum of the meter visual display.

The invention also employs so-called flexible switch technology in which the contacts of a switch are formed as conducting areas on two neighbouring layers, separated by a thin intermediate layer which is apertured in the region of the contacts. At least one of the neighbouring layers is flexible so that when pressure is applied to it in the region of a contact, the switch contacts are urged together to close the switch.

Figure 1:
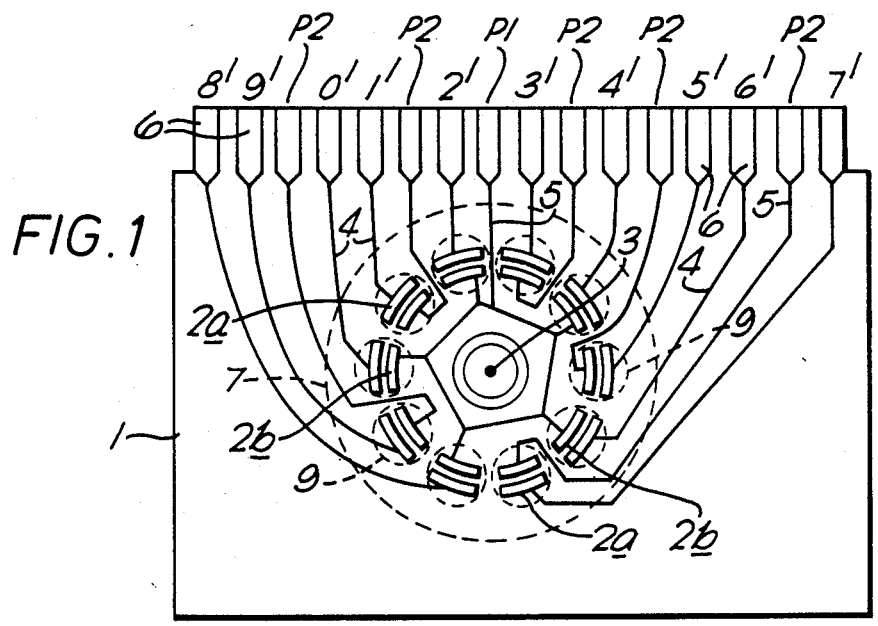
FIG. 1 is a plan view of one embodiment of encoder device according to the invention.
Figure 2:
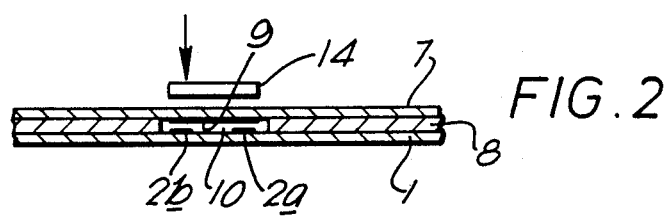
FIG. 2 is a radial section through a contact set of FIG. 1, on a greatly enlarged scale.

Referring now to FIGS. 1 and 2, which shows one form of encoder device according to the invention, a panel 1 of insulating material carries a series of conducting contacts each consisting of two contact portions 2a, 2b, and shown here as ten in number, which are disposed on a circular path about an axis of rotation 3. Conductors 4 are connected to each contact portion 2a, and similar conductors 5 are connected to each contact portion 2b. Each conductor 4,5 terminates in a terminal area 6 adjacent an edge of the panel 1. The structure so far described may conveniently be made as a printed circuit board.

A flexible member 7 of insulating material is disposed closely adjacent the panel 1 but is separated therefrom by a thin intermediate sheet 8 containing an aperture 10 in the region of each contact portion 2a, 2b. The flexible member 7 bears ten conducting contacts 9, one opposite each pair of contact portions 2a, 2b, thereby forming ten contact sets or switches. Due to the flexibility of the flexible member 7, pressure applied in the region of any conducting contact 9 will depress it sufficiently to engage the associated contact portions 2a, 2b through the associated aperture 10, thereby closing the switch. For the sake of clarity, the flexible member 7 and the conducting contacts 9 have been shown in broken lines in FIG. 1.

Pressure is applied to the conducting contacts 9 on the flexible member 7 through a switch actuating means 14 (FIG. 2) which is dimensioned or arranged such that either one contact set is closed or two adjacent contact sets are closed for any angular position about the axis of rotation 3.

More specifically, the switch actuating means 14 may be formed as a projection of a length or circumferential extent which is greater than the gap between two adjacent contact sets. Alternatively, the switch actuating means may comprise two projections which are spaced such that at least one of the projections is always operative to close a contact set.

A D.C. input voltage of, e.g., 5 volts is applied to the encoder via the inputs P1, P2, which with the associated conductors 5 form two groups of power supply conductors connected alternately to successive ones of the contact portions 2b. Such an arrangement is necessary in order to prevent two adjacent switches being shorted together when the switch actuating means 14 is in an angular position where two adjacent contact sets are closed.

In practice, the switch actuating means 14 is attached to an associated encoded drum (not shown) which is mounted to rotate about the axis of rotation 3 and which bears the digits 0 to 9 on its periphery.

As the drum rotates, the switch actuating means 14 makes successive pressure contact with each of the ten conducting contacts 9. Each contact portion 2a corresponds with one of the ten digits 0 to 9, on the periphery of the drum, and is connected through a conductor 4 to those terminal areas labelled 0' to 9'. The contact portions 2b are connected through the conducting contacts 9 and terminal areas P1, P2 to the D.C. input voltage of about +5 volts. This voltage is transferred to any one of the ten contact portion 2a when a contact set is closed by pressure on a contact 9, depending on the angular position of the drum. The outputs 0' to 9', which carry the output voltages, are connected to a microprocessor which sequentially scans the corresponding ten inputs and detects the presence or absence of +5 volts. In this manner, the drum reading is determined. Each drum of a series of drums (e.g., in a meter) is scanned in turn.

In order to minimise the number of connections to the microprocessor, a matrix wiring arrangement is used i.e., common segments are connected. The meter reading may be output on command in any suitable manner (for example, serially) in pulse width modulated, b.c.d. format, or in serial, ASC II format.

With such an arrangement a meter can, for example, be read remotely by a hand held unit which stores the serially, transmitted, coded reading. This information can later be down loaded into a main frame computer for record purposes and for automated billing in the case of a consumer's meter.

Figure 3:
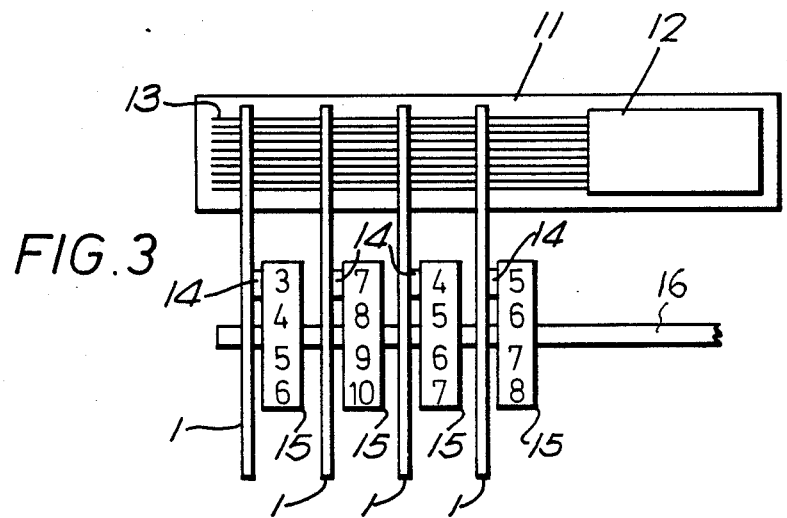
FIG. 3 illustrates part of a meter display embodying a plurality of encoder devices as shown in FIG. 1 and forming an absolute encoder.

FIG. 3 shows somewhat diagrammatically a meter visual display comprising four such encoder devices each one of which is associated with a corresponding numerical drum 15 to form an absolute encoder for the meter index reading. The panels 1 are vertically disposed adjacent the numerical drums 15, each of which rotates about a horizontal axis 16 provided by a shaft. The terminal areas 6 from the panels 1 are connected to the circuitry of a mother board 11 including an integrated circuit 12. The integrated circuit 12 sequentially scans the ten inputs (one per segment) to detect the presence or absence of a voltage on a particular segment. In this manner a meter reading is obtained. The integrated circuit 12 also converts the reading into a binary form, ASC II, suitable for serial transmission.

Each common segment on the four panels 1 is connected together to form a matrix wiring formation 13—i.e., only ten inputs to the integrated circuit 12 are necessary.

The switch actuating means are shown diagrammatically at 14 and, as mentioned above, are so dimensioned that, during changeover of digits, at least one switch or contact set is always closed.

It will thus be seen that, with the arrangement according to the present invention, a reading is always possible, and there is no time period during the rotation of any drum when a reading cannot be obtained. Although four drums have been shown, clearly any other number of drums and associated encoder devices can be provided.

The absolute encoder according to this invention has the advantages of small cost and the ability to produce a sealed construction which is not prone to long term corrosion problems.

It particularly finds application where:
(a) accurate readings are necessary; and
(b) where "null readings" are undesirable. For example:
  (1) Door step meter reading. A reading can be made using a hand held unit. The reading can then be down loaded onto a main frame computer for automatic billing.
  (2) Remote meter reading where, for example, information is transmitted down telephone lines.
  (3) For use with electronic token meters. In this application, the absolute encoded index transmits the reading to the electronic meter where, the appropriate charges can be calculated.

Although the invention has been specifically described in association with gas meters, it will be understood that it may be applied to a wide variety of other meters and analogous devices.

I claim:

1. An encoder device for encoding angular position in the form of electrical signals, said encoder device comprising:
   (a) a rotatable member having an axis of rotation and
   (b) a series of discrete fixed contacts disposed about the axis of rotation of said rotatable member,
   wherein:
   (c) said series of discrete fixed contacts form a first group of contacts of a flexible switch structure;
   (d) a second group of contacts is carried on one side of a flexible carrier of electrically insulating material, said second group of contacts being arranged such that each contact of said second group of contacts is located opposite to, but spaced from, one of said first group of contacts to form a contact set;
   (e) said rotatable member carries a switch actuating means:
   (i) which is electrically insulated from said second group of contacts by said flexible carrier and
   (ii) which operates to close any of said contact sets, in dependence upon angular position of said rotatable member; and
   (f) said switch actuating means is such that either one contact set is closed or two adjacent contact sets are closed for any angular position of said rotatable member.

2. An encoder device as claimed in claim 1 wherein said switch actuating means comprises a projection of a length of circumferential extent which is greater than the gap between two adjacent contacts of a group.

3. An encoder device as claimed in claim 1 wherein said switch actuating means comprises two projections which are spaced such that at least one of said projections is always in closing relationship with a contact set.

4. An encoder device as claimed in claim 1 wherein each of said first group of contacts comprises two contact portions.

5. An encoder device as claimed in claim 1 wherein:
   (a) said series of discrete fixed contacts are formed as printed circuit contacts on a relatively rigid support and
   (b) said second group of contacts are formed as printed circuit contacts.

6. An encoder device as claimed in claim 5 wherein said second group of contacts:
   (a) are formed on said flexible carrier and
   (b) are separated from said relatively rigid support by a further sheet having apertures opposite each of said contact sets.

7. An encoder device as claimed in claim 6 and further comprising conductors:
   (a) carried by said relatively rigid support and
   (b) extending from each of said contacts to a terminal region at an edge of said relatively rigid support.

8. An encoder device as claimed in claim 7 and further comprising two groups of power supply conductors connected alternately to the successive ones of said first group of contacts.

9. An encoder device as claimed in claim 1 wherein said rotatable member is a drum:
   (a) mounted for rotation about said axis of rotation and
   (b) bearing a series of numbers or other indicia on its periphery corresponding to said series of discrete fixed contacts.

10. An encoder device as claimed in claim 9 wherein:
    (a) said drum bears a decade of numbers on its periphery and
    (b) ten fixed contacts are provided in said first group of contacts.

11. An encoder device as claimed in claim 1 wherein said rotatable member is adapted to rotate in only one direction and by an arbitrary number of rotations.

12. An absolute encoder comprising:
    (a) a plurality of encoder devices as claimed in claim 1 and
    (b) circuit means for producing an absolute encoded output.

13. An absolute encoder as claimed in claim 12 comprising a plurality of encoder devices wherein:
    (a) in respect of each device, said rotatable member is a drum:
    (i) mounted for rotation about said axis of rotation and
    (ii) bearing a series of indicia on its periphery corresponding to said series of discrete fixed contacts;
    (b) said drums are mounted side-by-side for rotation about a common axis of rotation;
    (c) the outputs from the fixed contacts associated with each drum:
    (i) are commoned for the corresponding contacts and
    (ii) are fed to the input of said circuit means; and
    (d) said circuit means:
    (i) sequentially scans the commoned contacts to determine the presence or absence of a voltage on a particular contact and
    (ii) produces an output representative of the positions of said drums.

14. An absolute encoder as claimed in claim 13 wherein said common axis of rotation is horizontal.

15. An absolute encoder as claimed in claim 12 wherein said circuit means is an integrated circuit.

* * * * *